US009711357B1

(12) United States Patent
Weber et al.

(10) Patent No.: US 9,711,357 B1
(45) Date of Patent: Jul. 18, 2017

(54) METHOD OF MANUFACTURING A SEMICONDUCTOR DEVICE WITH EPITAXIAL LAYERS AND AN ALIGNMENT STRUCTURE

(71) Applicant: Infineon Technologies Austria AG, Villach (AT)

(72) Inventors: Hans Weber, Bayerisch Gmain (DE); Andreas Moser, Maria-Rain (AT); Johannes Baumgartl, Riegersdorf (AT); Gabor Mezoesi, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/075,815

(22) Filed: Mar. 21, 2016

(51) Int. Cl.
| | |
|---|---|
| *H01L 21/033* | (2006.01) |
| *H01L 21/324* | (2006.01) |
| *H01L 29/06* | (2006.01) |
| *H01L 21/265* | (2006.01) |
| *H01L 21/225* | (2006.01) |
| *H01L 21/78* | (2006.01) |
| *H01L 23/544* | (2006.01) |
| *H01L 29/04* | (2006.01) |
| *H01L 29/66* | (2006.01) |

(52) U.S. Cl.
CPC ........ *H01L 21/033* (2013.01); *H01L 21/2254* (2013.01); *H01L 21/26513* (2013.01); *H01L 21/324* (2013.01); *H01L 21/78* (2013.01); *H01L 23/544* (2013.01); *H01L 29/045* (2013.01); *H01L 29/0634* (2013.01); *H01L 29/66795* (2013.01)

(58) Field of Classification Search
CPC combination set(s) only.
See application file for complete search history.

(56) References Cited

U.S. PATENT DOCUMENTS

| | | | | |
|---|---|---|---|---|
| 8,012,832 | B2 * | 9/2011 | Saggio | H01L 29/0634 257/342 |
| 8,435,865 | B2 | 5/2013 | Kodama | |
| 2015/0357406 | A1 * | 12/2015 | Guan | H01L 29/0634 257/493 |

OTHER PUBLICATIONS

Weber, Hans et al., "Robuste Designformen gegenüber Epitxie-Überschichtung", Siemens Technik Report, Jg. 5, Nr. 16, Apr. 2002.

* cited by examiner

*Primary Examiner* — Mamadou Diallo
(74) *Attorney, Agent, or Firm* — Murphy, Bilak & Homiller, PLLC

(57) ABSTRACT

A semiconductor device is manufactured in a semiconductor body by forming an initial mask on a process surface of a semiconductor layer, openings in the mask exposing a part of the semiconductor layer in alignment structure and super-junction structure areas. A recess structure is formed in the semiconductor layer at portions of the process surface that are exposed by the openings, the recess structure in the alignment structure area constituting an initial alignment structure. Dopants are introduced into the semiconductor layer through portions of the process surface that are exposed by the openings of the initial mask. The dopants introduced in the super-junction area constitute part of a super-junction structure. A thickness of the semiconductor layer is increased by growing an epitaxial layer. The initial alignment structure is imaged into the process surface. Dopants are introduced into the semiconductor layer by using a mask aligned to the initial alignment structure.

19 Claims, 11 Drawing Sheets

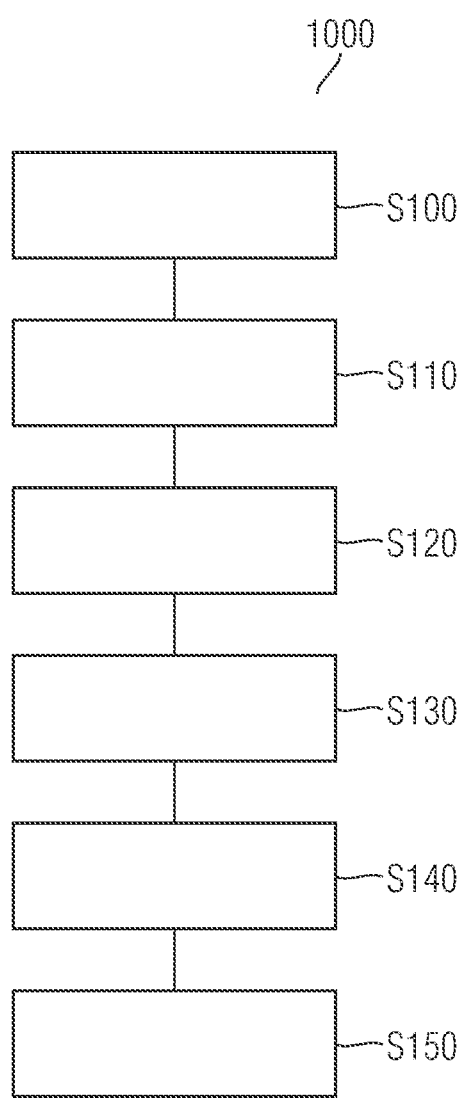

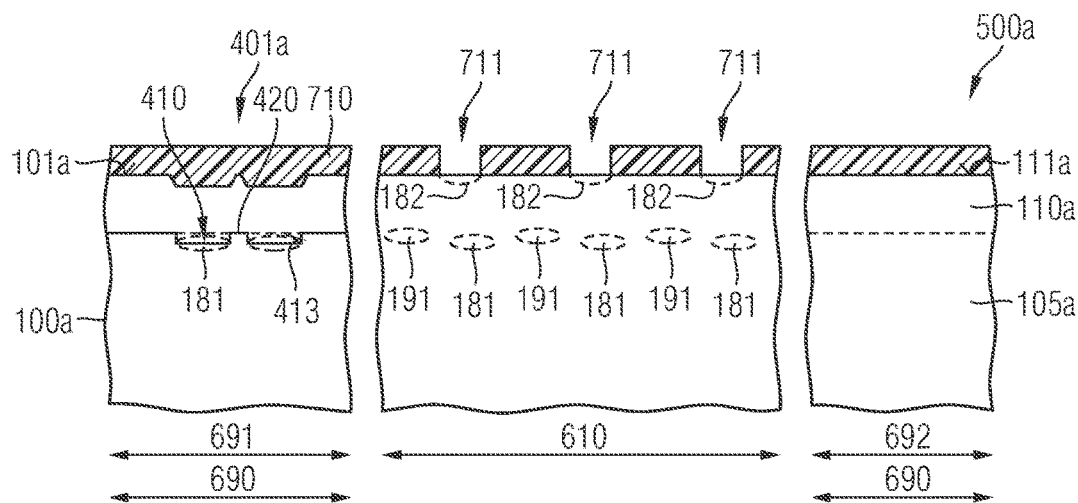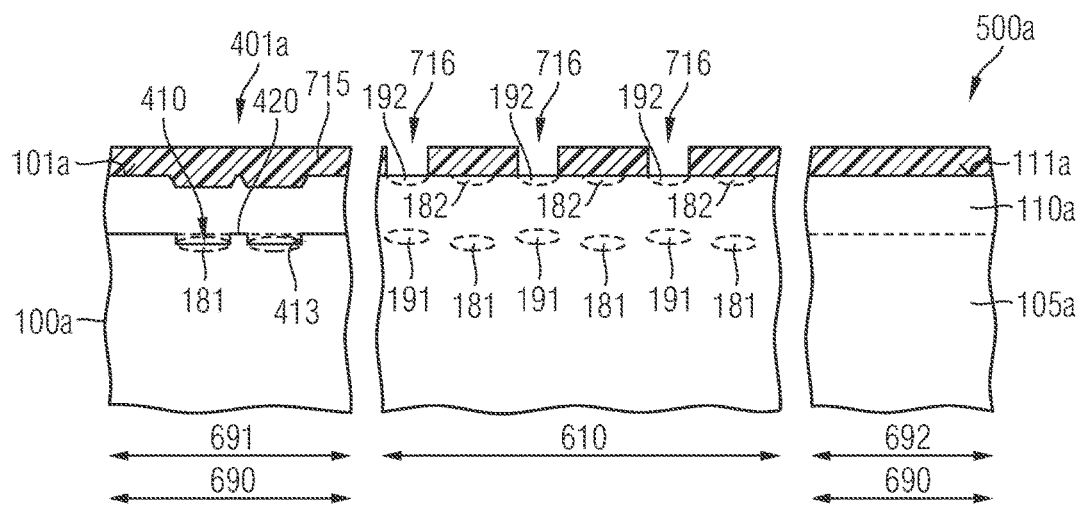

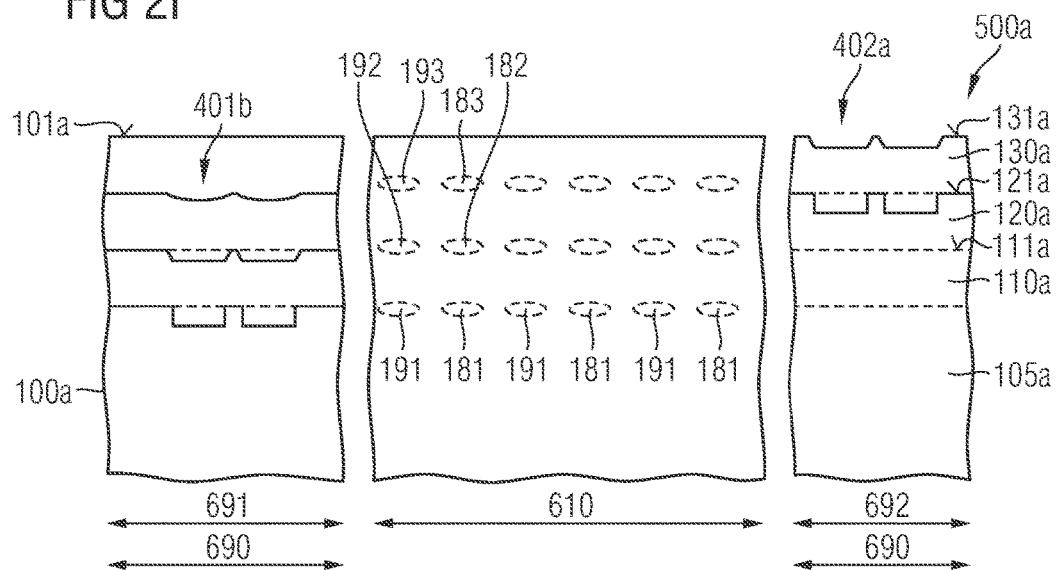
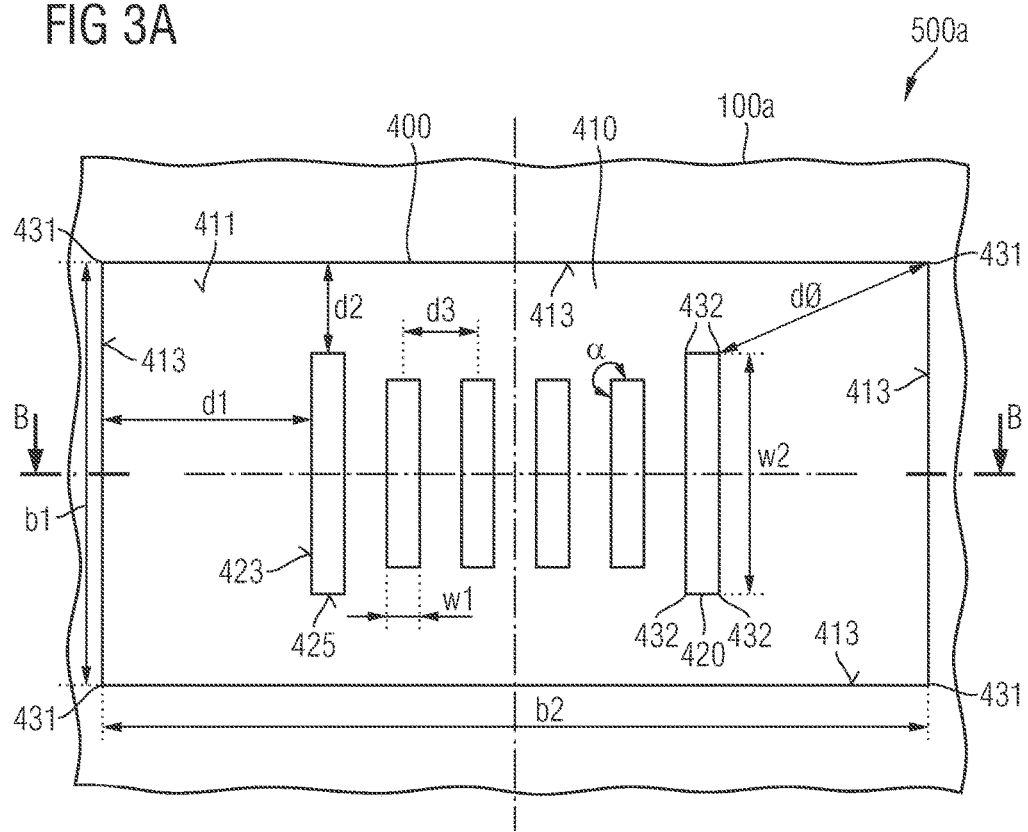

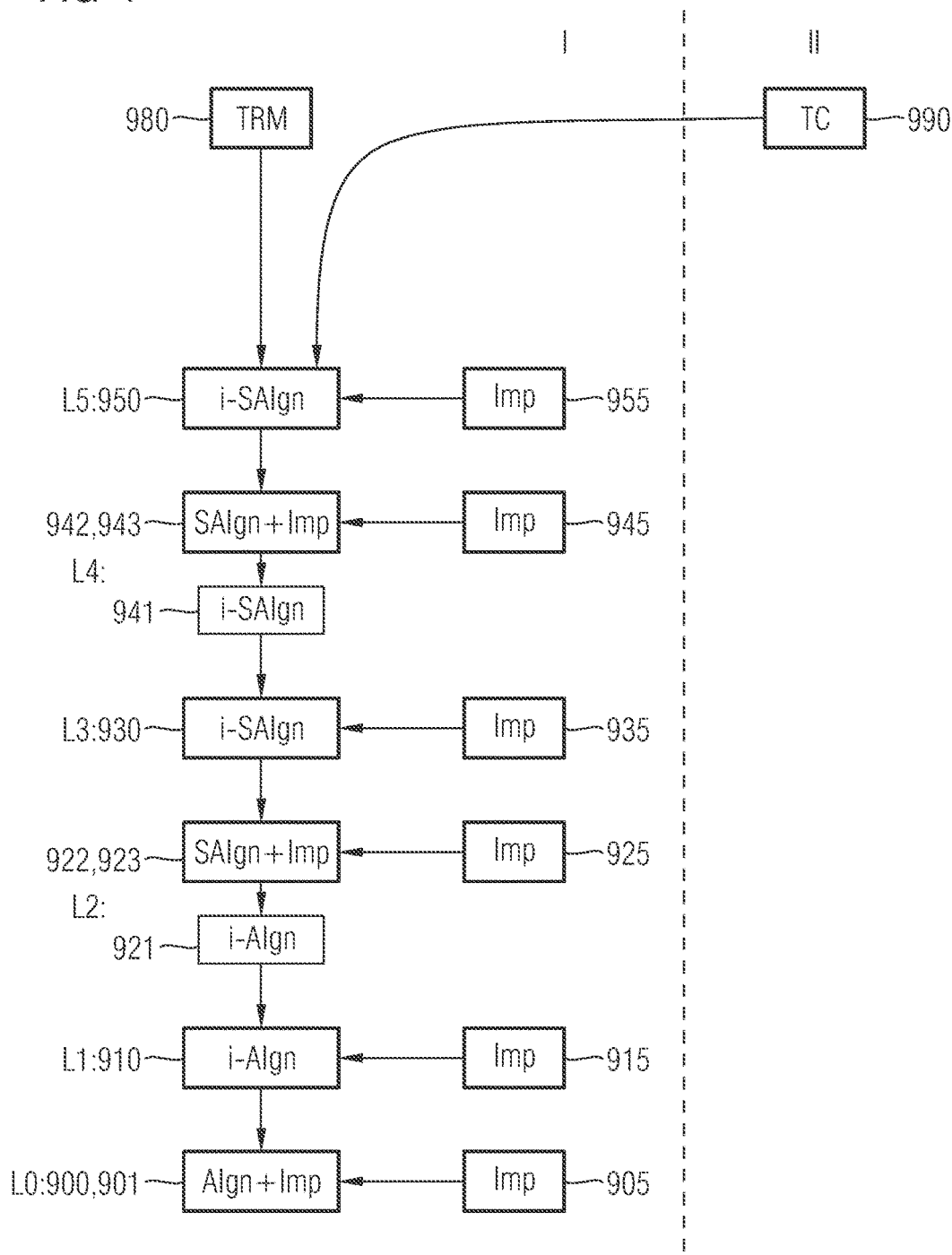

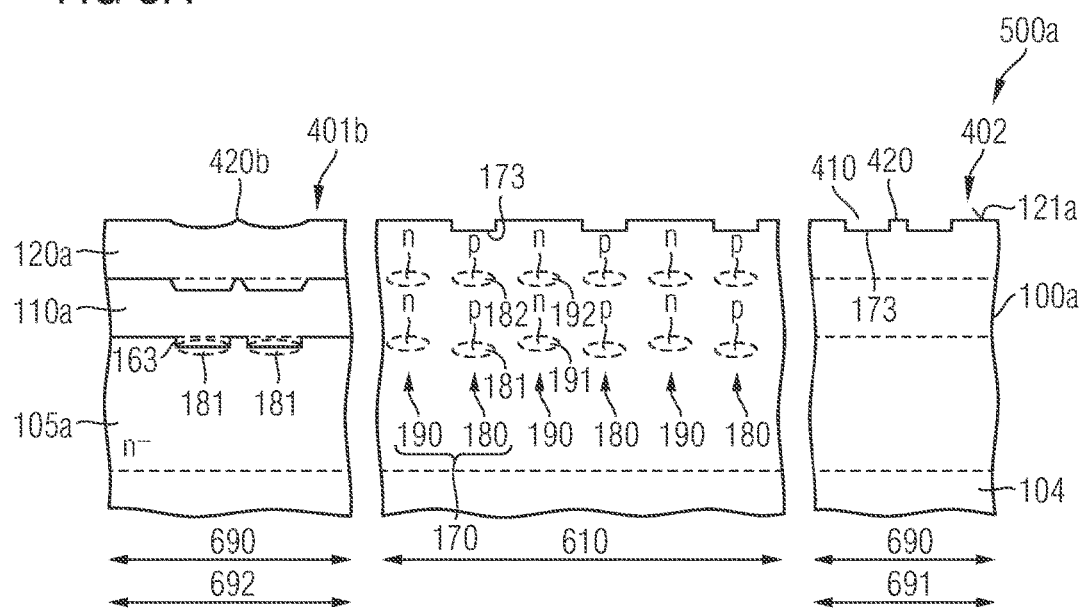
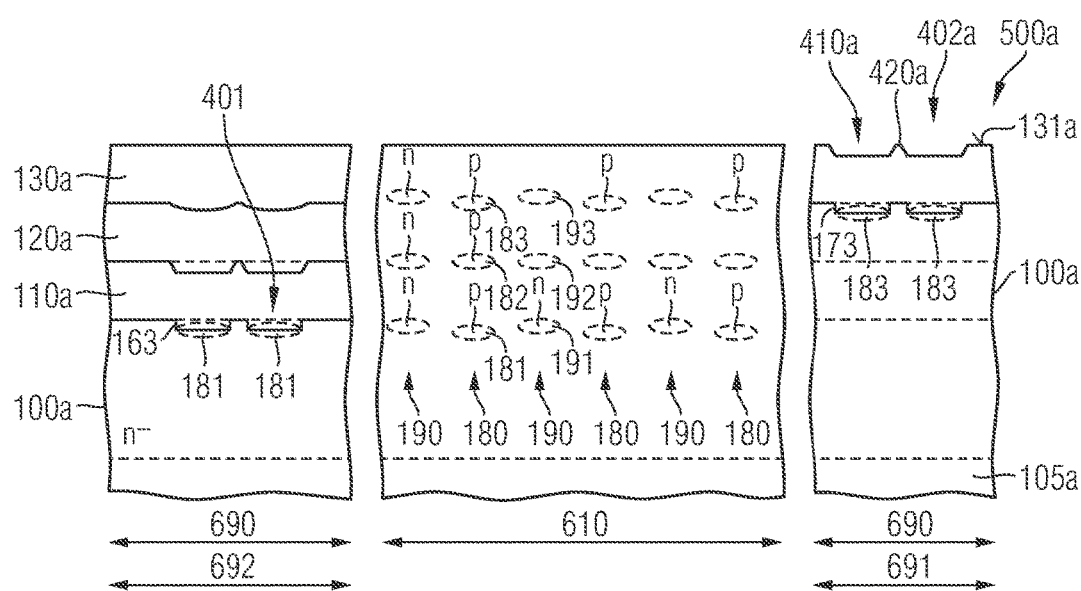

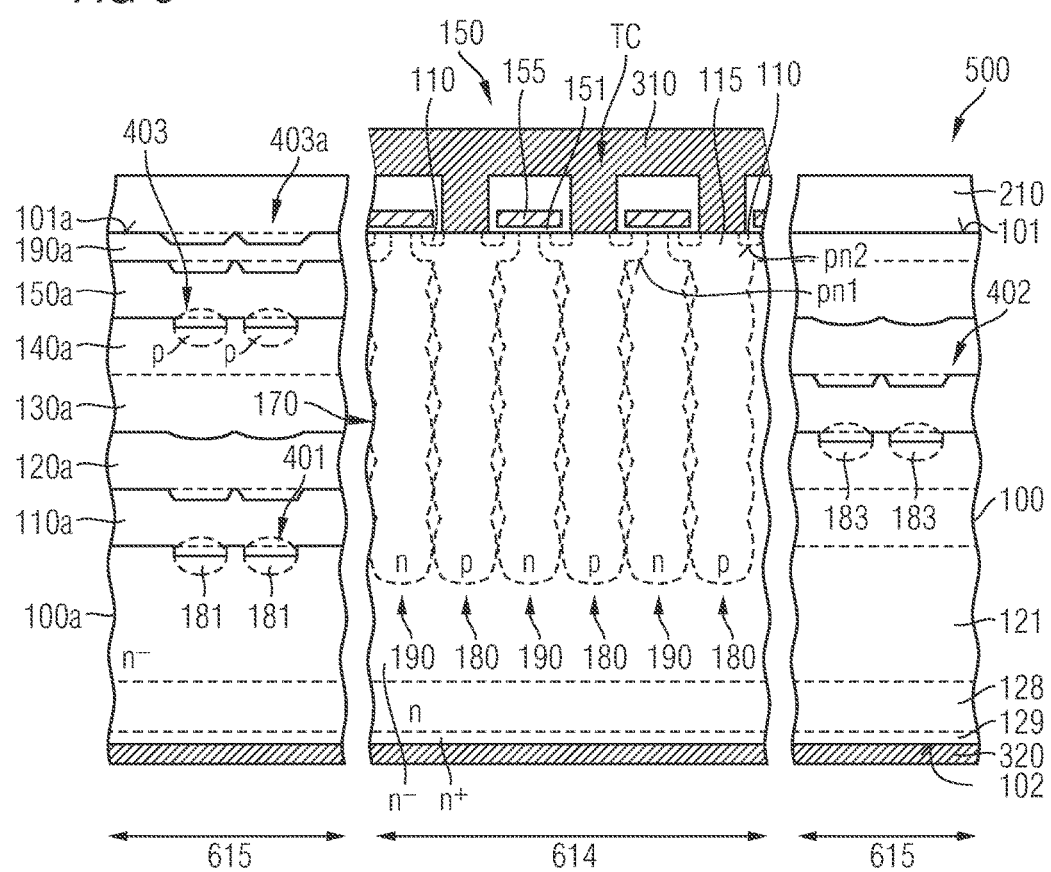

METHOD OF MANUFACTURING A SEMICONDUCTOR DEVICE WITH EPITAXIAL LAYERS AND AN ALIGNMENT STRUCTURE

BACKGROUND

Manufacturing of semiconductor devices may include multi-step epitaxy, wherein device formation processes may be performed between successive epitaxy processes. Conventionally, device regions formed in the different epitaxial layers are adjusted to each other by aligning exposure masks to an alignment structure formed prior to the epitaxy processes in a base substrate onto which the epitaxial layers are successively grown. Typical alignment structures are based on grooves or recesses etched into the base substrate and imaged into an exposed surface of the respective epitaxial layer.

It is desirable to simplify process complexity of forming device patterns in successively grown epitaxial layers that are aligned with respect to an alignment structure.

SUMMARY

The present disclosure relates to a method of manufacturing a semiconductor device. The method comprises forming an initial mask on a process surface of a semiconductor layer, the initial mask comprising openings exposing a part of the semiconductor layer in an alignment structure area and in a super-junction structure area. The method further comprises forming a recess structure in the semiconductor layer at portions of the process surface that are exposed by the openings of the initial mask, wherein the recess structure in the alignment structure area constitutes an initial alignment structure. The method further comprises introducing dopants into the semiconductor layer through portions of the process surface that are exposed by the openings of the initial mask, wherein the dopants introduced in the super-junction area constitute part of a super-junction structure. The method further comprises increasing a thickness of the semiconductor layer by growing an epitaxial layer, wherein the initial alignment structure is imaged into the process surface. The method further comprises introducing dopants into the semiconductor layer by using a mask aligned to the initial alignment structure. The method further comprises increasing a thickness of the semiconductor layer by growing an epitaxial layer.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. The drawings are not necessarily to scale. Different spatial axes may have different scales.

FIG. 1 is a schematic flow diagram for illustrating a method of manufacturing a semiconductor device with epitaxial layers and an alignment structure.

FIG. 2E is a schematic vertical cross-sectional view of the semiconductor substrate portions of FIG. 2D, after a third device formation process aligned to a projection of the initial alignment structure in an exposed surface of the first epitaxial layer.

FIG. 2F is a schematic vertical cross-sectional view of the semiconductor substrate portions of FIG. 2E, after a fourth device formation process aligned to the projection of the initial alignment structure in the exposed surface of the first epitaxial layer.

FIG. 2I is a schematic vertical cross-sectional view of the semiconductor substrate portions of FIG. 2H, after forming a further epitaxial layer.

FIG. 3A is a schematic plan view of a portion of a semiconductor substrate including an alignment structure based on a wide recess formed in a process surface according to an embodiment.

FIG. 4 is a diagram schematically illustrating alignment relationships among device formation processes according to an embodiment referring to the manufacture of super-junction semiconductor devices.

FIG. 5A is a schematic vertical cross-sectional view of portions of a semiconductor substrate according to an embodiment referring to a substitutional alignment structure in an exposed surface of an epitaxial layer.

FIG. 5B is a schematic vertical cross-sectional view of portions of a semiconductor substrate with a substitutional alignment structure imaged into an exposed surface of an epitaxial layer.

FIG. 6 is a schematic vertical cross-sectional view of portions of a semiconductor device including a super-junction structure and a substitutional alignment structure imaged into a first surface.

DETAILED DESCRIPTION

Figure 2A:
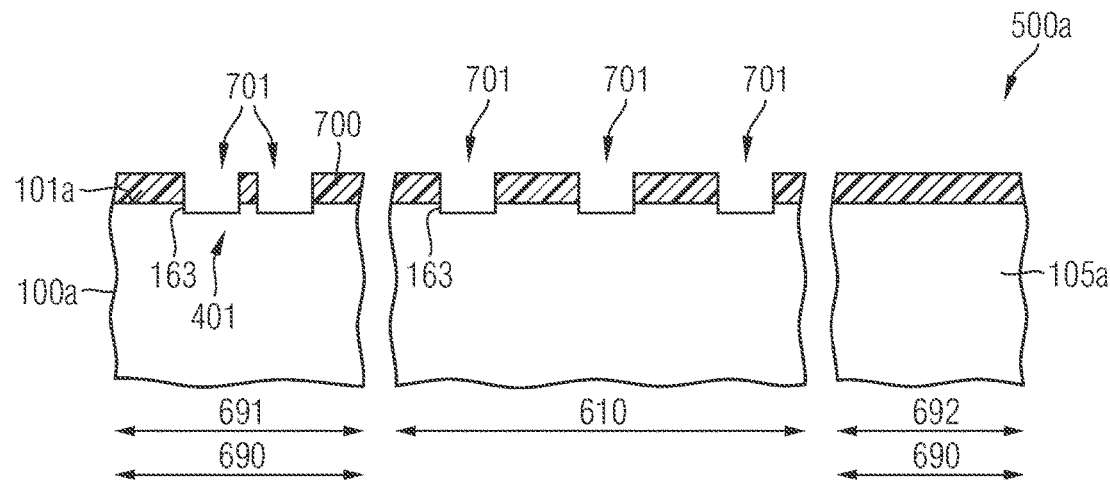
FIG. 2A is a schematic vertical cross-sectional view of a first portion of a semiconductor substrate used as a device area and of second portions used as kerf area for illustrating a method of manufacturing a semiconductor device, after forming an initial alignment structure in a semiconductor layer by an initial alignment mask.

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

The terms "wafer", "substrate", "semiconductor body" or "semiconductor substrate" used in the following description may include any semiconductor-based structure that has a semiconductor surface. Wafer and structure are to be understood to include silicon (Si), silicon-on-insulator (SOI), silicon-on sapphire (SOS), doped and undoped semiconductors, epitaxial layers of silicon supported by a base semiconductor foundation, and other semiconductor structures. As a typical base material for manufacturing a variety of such semiconductor devices, silicon wafers grown by the Czochralski (CZ) method, e.g. by the standard CZ method or by the magnetic CZ (MCZ) method or by the Continuous CZ (CCZ) method may be used. Also FZ (Float-Zone) silicon wafers may be used. The semiconductor need not be silicon-based. The semiconductor could as well be silicon germanium (SiGe), germanium (Ge) or gallium arsenide (GaAs). According to other embodiments, silicon carbide (SiC) or gallium nitride (GaN) may form the semiconductor substrate material.

The term "horizontal" as used in this specification intends to describe an orientation substantially parallel to a first or main surface of a semiconductor substrate or body. This can be for instance the surface of a wafer or a semiconductor die.

The term "vertical" as used in this specification intends to describe an orientation which is substantially arranged perpendicular to the first surface, i.e. parallel to the normal direction of the first surface of the semiconductor substrate or body.

In this specification, a second surface of a semiconductor substrate or semiconductor body is considered to be formed by the lower or backside or rear surface while the first surface is considered to be formed by the upper, front or main surface of the semiconductor substrate. The terms "above" and "below" as used in this specification therefore describe a relative location of a structural feature to another.

In this specification, embodiments are illustrated including p- and n-doped semiconductor regions. Alternatively, the semiconductor devices can be formed with opposite doping relations so that the illustrated p-doped regions are n-doped and the illustrated n-doped regions are p-doped.

The semiconductor device may have terminal contacts such as contact pads (or electrodes) which allow electrical contact to be made with the integrated circuit or discrete semiconductor device included in the semiconductor body. The electrodes may include one or more electrode metal layers which are applied to the semiconductor material of the semiconductor chips. The electrode metal layers may be manufactured with any desired geometric shape and any desired material composition. The electrode metal layers may, for example, be in the form of a layer covering an area. Any desired metal, for example Cu, Ni, Sn, Au, Ag, Pt, Pd, Al, Ti and an alloy of one or more of these metals may be used as the material. The electrode metal layer(s) need not be homogenous or manufactured from just one material, that is to say various compositions and concentrations of the materials contained in the electrode metal layer(s) are possible. As an example, the electrode layers may be dimensioned large enough to be bonded with a wire.

In embodiments disclosed herein one or more conductive layers, in particular electrically conductive layers, are applied. It should be appreciated that any such terms as "formed" or "applied" are meant to cover literally all kinds and techniques of applying layers. In particular, they are meant to cover techniques in which layers are applied at once as a whole like, for example, laminating techniques as well as techniques in which layers are deposited in a sequential manner like, for example, sputtering, plating, molding, CVD (Chemical Vapor Deposition), physical vapor deposition (PVD), evaporation, hybrid physical-chemical vapor deposition (HPCVD), etc.

The applied conductive layer may comprise, inter alia, one or more of a layer of metal such as Al, Cu or Sn or an alloy thereof, a layer of a conductive paste and a layer of a bond material. The layer of a metal may be a homogeneous layer. The conductive paste may include metal particles distributed in a vaporizable or curable polymer material, wherein the paste may be fluid, viscous or waxy. The bond material may be applied to electrically and mechanically connect the semiconductor chip, e.g., to a carrier or, e.g., to a contact clip. A soft solder material or, in particular, a solder material capable of forming diffusion solder bonds may be used, for example solder material comprising one or more of Sn, SnAg, SnAu, SnCu, In, InAg, InCu and InAu.

A dicing process may be used to divide the wafer into a plurality of semiconductor dies (individual chips). Any technique for dicing may be applied, e.g., blade dicing (sawing), laser dicing, etching.

FIG. 1 is a schematic flow diagram for illustrating a method 1000 of manufacturing a semiconductor device.

It will be appreciated that while method 1000 is illustrated and described below as a series of acts or events, the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects of embodiments of the disclosure herein. Also, one or more of the acts depicted herein may be carried out in one or more separate act and/or phases.

Process feature S100 comprises forming an initial mask on a process surface of a semiconductor layer, the initial mask comprising openings exposing a part of the semiconductor layer in an alignment structure area and in a super-junction structure area.

Process feature S110 comprises forming a recess structure in the semiconductor layer at portions of the process surface that are exposed by the openings of the initial mask, wherein the recess structure in the alignment structure area constitutes an initial alignment structure.

Process feature S120 comprises introducing dopants into the semiconductor layer through portions of the process surface that are exposed by the openings of the initial mask, wherein the dopants introduced in the super-junction area constitute part of a super-junction structure.

Process feature S130 comprises increasing a thickness of the semiconductor layer by growing an epitaxial layer, wherein the initial alignment structure is imaged into the process surface.

Process feature S140 comprises introducing dopants into the semiconductor layer by using a mask aligned to the initial alignment structure.

Process feature S150 comprises repeating process feature S130.

FIGS. 2A to 2J refer to a method of manufacturing a super-junction semiconductor device.

Referring to the schematic cross-sectional view illustrated in FIG. 2A, a semiconductor substrate 500a may consist of or include a semiconductor layer 100a which may include an epitaxy base 105a grown on a base substrate of a crystalline semiconductor material such as silicon, for example a silicon wafer cut from a silicon ingot. The semiconductor substrate 500a includes a device area 610, for example a super-junction structure area in which semiconductor dies for semiconductor devices are formed, and a kerf area or alignment structure area 690 that separates neighboring device areas 610. The kerf area 690 may form a grid with the device area 610 forming the meshes.

An initial alignment structure 401 is formed in a first kerf portion 691 of the kerf area 690, for example, by depositing a mask layer on a process surface 101a of the semiconductor layer 100a, patterning the mask layer by photolithography to form an initial alignment mask 700 with initial alignment mask openings 701 and using the initial alignment mask 700 as an etch mask for forming the initial alignment structure 401 in the process surface 101a. The initial alignment mask 700 includes the initial alignment mask openings 701 not only in the kerf area 690 but also in the device area 610. Hence, also in the device area 610, recesses 163 are formed in the process surface 101a, for example by an anisotropic and/or isotropic etching process. The initial alignment mask openings 701 of the initial alignment mask 700 in the device area 610 may define a layout of charge compensation regions of a super-junction structure, for example. The initial alignment mask openings 701 and recesses 163 in the kerf area 690 and in the device area 610 may differ with respect to their lateral dimensions, for example. In some embodiments, a lateral dimension of the initial alignment mask openings 701 and recesses 163 in the kerf area is larger than a lateral dimension of the openings 701 and recesses 163 in the device area 610, for example by a factor greater than 2, or greater than 3, or greater than 5.

FIG. 2A shows the initial alignment structure 401 in a first kerf portion 691 at the left-hand side.

Figure 2B:
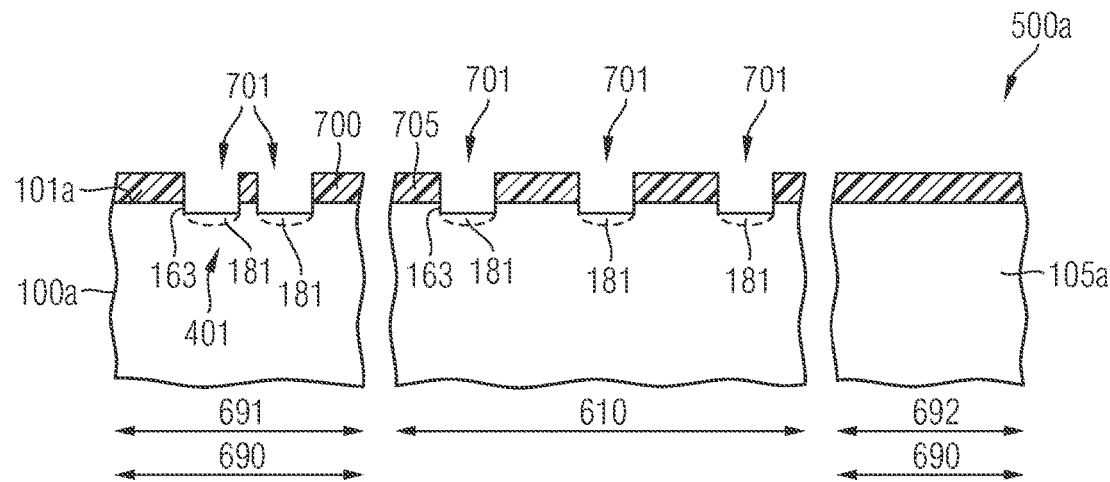
FIG. 2B shows the semiconductor substrate portions of FIG. 2A after implanting dopants though openings of the initial alignment mask into the semiconductor layer.

Referring to the schematic cross-sectional view illustrated in FIG. 2B, p-type dopants are implanted through the initial alignment mask openings 701 of the initial alignment mask 700 into the semiconductor layer 100a in the kerf area 690 and in the device area 610.

FIG. 2B illustrates first p-type implant regions 181 formed in the semiconductor layer 100a at positions defined by the initial alignment mask openings 701 of the initial alignment mask 700. The initial alignment mask 700 is removed.

Figure 2C:
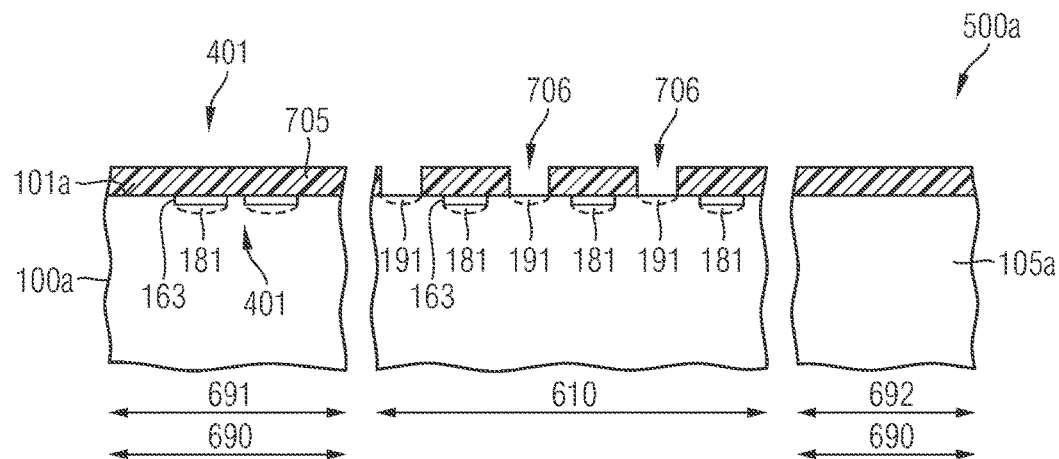
FIG. 2C shows the semiconductor substrate portions of FIG. 2B after a second device formation process directly aligned to the initial alignment structure.

A following optional device formation process illustrated with respect to the schematic cross-sectional view of FIG. 2C includes a patterning process directly aligned to the initial alignment structure 401. The patterning process concerns the device area 610 and may include deposition, etching, oxidation, and implant processes. In the illustrated embodiment, a first mask layer is deposited on the process surface 101a and patterned by photolithography that evaluates the position of the initial alignment structure 401 to adjust the exposure pattern for forming, from the first mask layer, a first implant mask 705 with first implant mask openings 706 directly aligned to the initial alignment structure 401. N-type dopants may be implanted through the first implant mask openings 706.

FIG. 2C shows first n-type implant regions 191 in the semiconductor layer 100a, wherein the position of the first n-type implant regions 191 is horizontally aligned to the first p-type implant regions 181 by directly using position information derived from the initial alignment structure 401. The first implant mask 705 for the semiconductor layer 100a is removed.

The optional device formation process illustrated with respect to the schematic cross-sectional view of FIG. 2C may be omitted in case of introduction of n-type dopants by a doping process that does not require masked ion implantation such as, for example, an unmasked ion implantation process. An unmasked ion implantation process may be carried out, for example, prior to formation of the initial alignment mask 700 or after removal of the initial alignment mask 700. Another example of introduction of n-type dopants by a doping process that does not require masked ion implantation is in-situ doping during subsequent epitaxial growth on the process surface 101. In case of omission of the device formation process illustrated with respect to the schematic cross-sectional view of FIG. 2C, the process described with respect to FIG. 2B may be followed by the process described with reference to FIG. 2D.

Figure 2D:
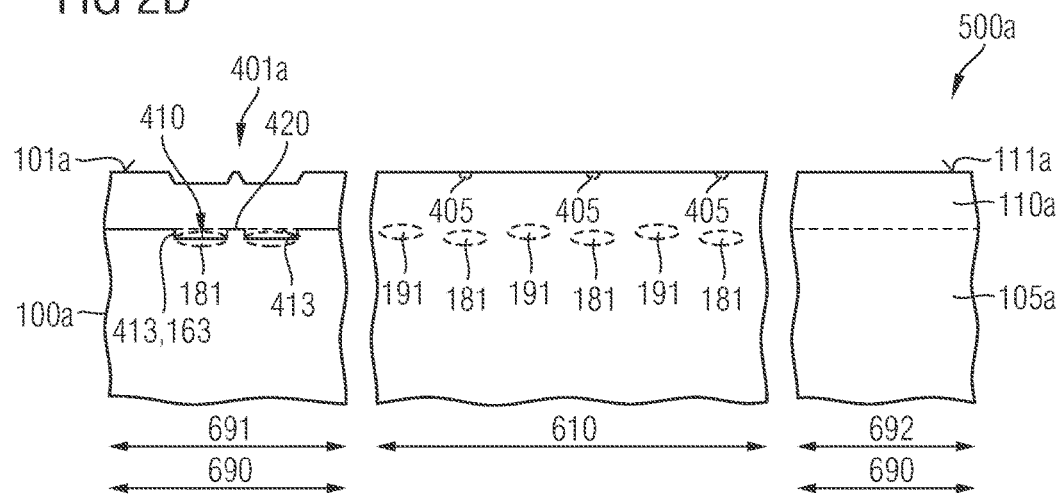
FIG. 2D is a schematic vertical cross-sectional view of the semiconductor substrate portions of FIG. 2C, after forming a first epitaxial layer.

Referring to the schematic cross-sectional view of FIG. 2D, an epitaxy process increases thickness of the semiconductor layer 100a by forming a first epitaxial layer 110a.

FIG. 2D shows a projected alignment structure 401a, which is the image of the initial alignment structure 401 projected into the exposed surface 111a of the first epitaxial layer 110a, that forms the new process surface 101a of the semiconductor layer 100a. The first epitaxial layer 110a may have a thickness in a range between 1 µm and 15 µm, for example in a range from 2 µm to 8 µm. The epitaxy tilts sidewalls of the initial alignment structure 401 when the initial alignment structure 401 is imaged into the exposed surface 111a of the first epitaxial layer 110a. A sufficient distance between fins 420 and sidewalls of a recess or groove 410 of the initial alignment structure 401 secures that the projected alignment structure 401a still provides sufficient optical contrast for the optical alignment device deriving position information from the projected alignment structure 401a. Outside of the projected alignment structure 401a the exposed surface 111a of the first epitaxial layer 110a is almost planar and flat. Depending on lateral and vertical dimensions of the recesses 163 in the device area 610 as well as a vertical dimension the first epitaxial layer 110a growing on the recesses 163 or depending on the epitaxial process, the recesses 163 in the device as illustrated in FIG. 2B may either be still visible at the exposed surface 111a of the first epitaxial layer 110a, for example as illustrated by projected recesses 405 or be not projected into the exposed surface 111a of the first epitaxial layer 110a other than the recesses or grooves 163,410 of the projected alignment structure 401a in the kerf area 690 which may have greater lateral dimensions than the recesses 163 in the device area 610. For illustration purposes, the projected recesses 405 in the device area 610, which may be present or not depending as described above, are not illustrated in the cross-sectional views following the process illustrated with respect to FIG. 2D.

Referring to the schematic cross-sectional view illustrated in FIG. 2E, an optical alignment device of an exposure tool evaluates the optical response of the projected alignment structure 401a to align an exposure mask for patterning a second implant mask 710 on the first epitaxial layer 110a. P-type dopants are implanted through second implant mask openings 711 of the second implant mask 710 for forming second p-type implant regions 182 formed by the implant in the first epitaxial layer 110a in the vertical projection of the first p-type implant regions 181. Both the second implant mask openings 711 and the first implant mask openings 706 of FIG. 2C are positioned in dependence of position information derived from the same initial alignment structure 401, either directly or indirectly through the projected alignment structure 401a.

Referring to the schematic cross-sectional view illustrated in FIG. 2F, the second implant mask 710 is removed. A further mask layer is deposited and patterned by photolithography using position information derived from the projected alignment structure 401a to form a third implant mask 715 comprising third implant mask openings 716 in the vertical projection of the first n-type implant regions 191 in the semiconductor layer 100a.

As shown in FIG. 2F, an implant through the third implant mask openings 716 forms second n-type implant regions 192.

Figure 2G:
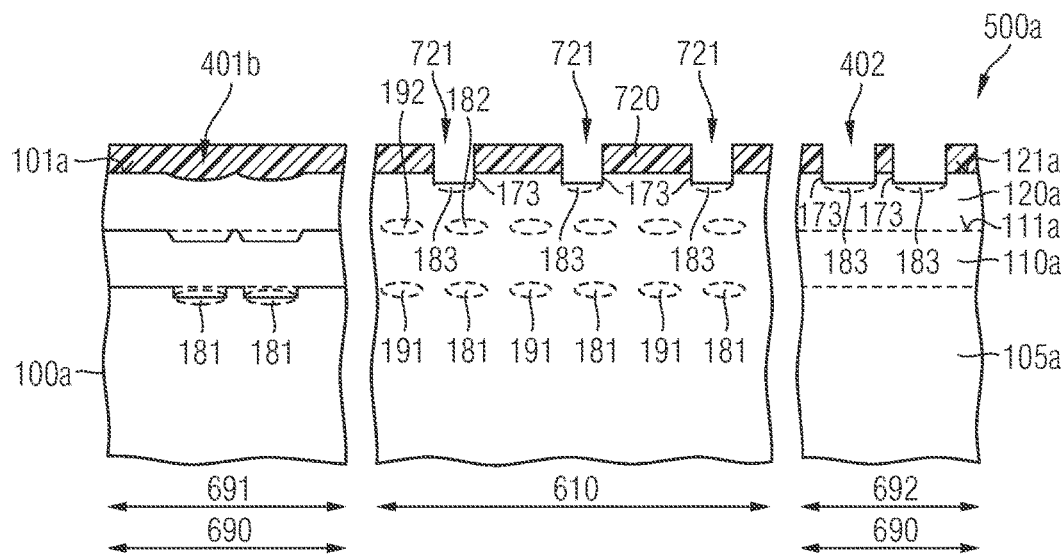
FIG. 2G is a schematic vertical cross-sectional view of the semiconductor substrate portions of FIG. 2F, after forming a substitutional alignment structure in a further epitaxial layer, and after implanting dopants through openings of a substitutional alignment mask into a device area of the further epitaxial layer.

Referring to the schematic cross-sectional view illustrated in FIG. 2G, the third implant mask 715 is removed and a second epitaxial layer 120a is formed on the first epitaxial layer 110a. The processes for implanting and epitaxial growth may be repeated several times, wherein for each implant a projected alignment structure derived from the initial alignment structure 401 in the epitaxy base 105a is used for positioning the mask openings in the respective implant masks.

After a total epitaxial layer thickness has reached at least 10 µm, for example about 15 µm, and before forming a further implant mask on a semiconductor layer 100a, which includes all previously formed epitaxial layers, a second alignment mask layer is deposited and patterned by photolithography aligned to the projected alignment structure in the process surface 101a leading to a second or substitutional alignment mask 720. The substitutional alignment mask 720 comprises substitutional alignment mask openings 721 in the kerf area 690 and in the device area 610. Based on the substitutional alignment mask openings 721 of the substitutional alignment mask 720 in the kerf area 690, a substitutional alignment structure 402 including recesses 173 in the second epitaxial layer 120a is formed. The substitutional alignment structure 402 may be formed in the same first kerf portion 691 as the initial alignment structure 401. According to another embodiment illustrated in FIG. 2G, the substitutional alignment structure 402 may be formed in a second kerf portion 692 outside of the first kerf portion 691. The substitutional alignment structure 402 may have the same shape and dimensions as the initial alignment structure 401 in the epitaxy base 105a. Since the substitutional alignment mask 720 also comprises substitutional alignment mask openings 721 in the device area 610, the recesses 173 are also formed, in addition to the recesses 173 in the kerf area 690 constituting the substitutional alignment structure 402, in the device area 610. The recesses 173 in the device area 610 are formed in the vertical projection of the first and second p-type implant regions 181, 182. The substitutional alignment mask openings 721 and recesses 173 in the kerf area 690 and in the device area 610 may differ with respect to their lateral dimensions, for example. In some embodiments, a lateral dimension of the substitutional alignment mask openings 721 and recesses 173 in the kerf area 690 is larger than a lateral dimension of the substitutional alignment mask openings 721 and the recesses 173 in the device area 610, for example by a factor greater than 2, or greater than 3, or even greater than 5.

Dopants of the first conductivity type are implanted through the substitutional alignment mask openings 721 into the second epitaxial layer 120a. Thereby third p-type implant regions 183 are formed by the implant in the vertical projection of the first and second p-type implant regions 181, 182 in the first epitaxial layer 110a and the epitaxy base 105a. Similar to the first p-type implant regions 181 which are also formed in the kerf area 690 at a bottom side of the recesses 173 constituting the initial alignment structure 401, the third p-type implant regions 183 are also formed at a bottom side of the recesses 173 in the kerf area 690 constituting the substitutional alignment structure 402.

Figure 2H:
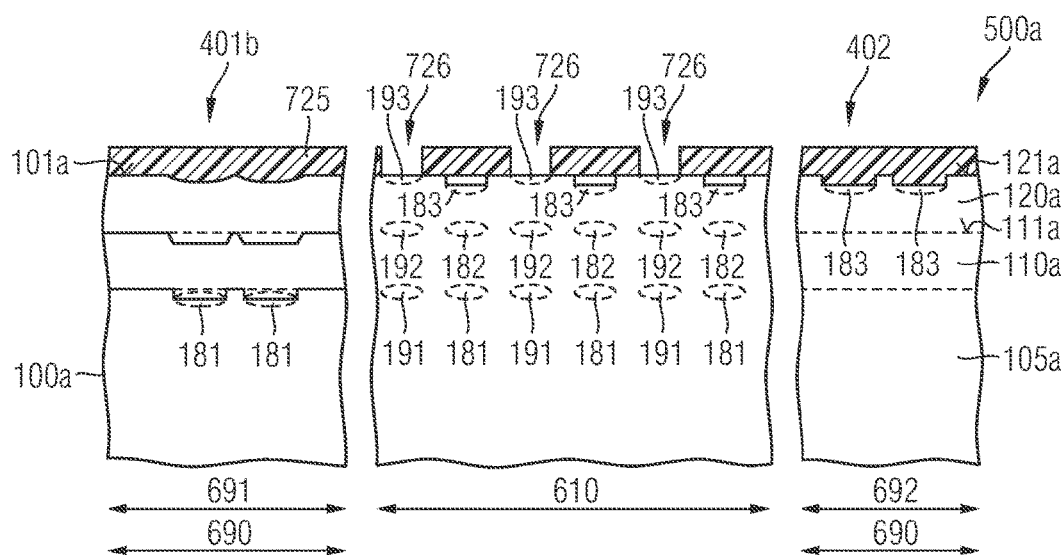
FIG. 2H is a schematic vertical cross-sectional view of the semiconductor substrate portions of FIG. 2G, after a further device formation process directly aligned to the substitutional alignment structure.

Referring to the schematic cross-sectional view illustrated in FIG. 2H, the substitutional alignment mask 720 is removed and an optional subsequent patterning process concerns the device area 610 and may include deposition, etching, oxidation, and implant processes. In the illustrated embodiment, a fourth mask layer is deposited on the process surface 101a and patterned by photolithography that evaluates the position of the substitutional alignment structure 402 to adjust the exposure pattern for forming, from the first mask layer, a fourth implant mask 725 with fourth implant mask openings 726 directly aligned to the substitutional alignment structure 402. N-type dopants of a second conductivity type may be implanted through the fourth implant mask openings 726 into the second epitaxial layer 120a, resulting in third n-type implant regions 193 in the second epitaxial layer 120a that are horizontally aligned to the third p-type implant regions 183 by directly using position information derived from the substitutional alignment structure 402. The fourth implant mask 725 for the second epitaxial layer 120a is removed.

The optional device formation process illustrated with respect to the schematic cross-sectional view of FIG. 2H may be omitted, similar to the process illustrated with respect to FIG. 2C, in case of introduction of the n-type dopants by a doping process that does not require masked ion implantation such as, for example, an unmasked ion implantation process. An unmasked ion implantation process may be carried out, for example, prior to formation of the substitutional alignment mask 720 or after removal of the substitutional alignment mask 720. Another example of introduction of n-type dopants by a doping process that does not require masked ion implantation is in-situ doping during subsequent epitaxial growth on the process surface 101. In case of omission of the device formation process illustrated with respect to the schematic cross-sectional view of FIG. 2H, the process described with respect to FIG. 2G may be followed by the process described with reference to FIG. 2I.

Referring to the schematic cross-sectional view illustrated in FIG. 2I, the fourth implant mask 725 may be removed and a third epitaxial layer 130a may be grown on the process surface 101a of the semiconductor layer 100a that includes all previously formed epitaxial layers.

FIG. 2I shows the third epitaxial layer 130a and vertically aligned columns of the first to third p-type implant regions 181, 182, 183 and vertically aligned columns of the first to third n-type implant regions 191, 192, 193.

The described use of each of the initial and substitutional alignment masks 700, 720 for formation of the alignment structures 401, 402 in the kerf area 690 and the p-type implant regions 181, 183 in the device area 610 reduces complexity and costs of lithography by forming the alignment structure and part of the device in the device area by a common mask in a single lithography process.

In the preceding description, at each stage the sequence of n-type implants and p-type implants may be changed. Instead of or in addition to implants, the device formation process between successive epitaxy processes may include patterned etch processes that may be performed in combination with preceding deposition processes, wherein materials other than crystalline semiconductor materials are deposited and patterned.

Figure 3B:
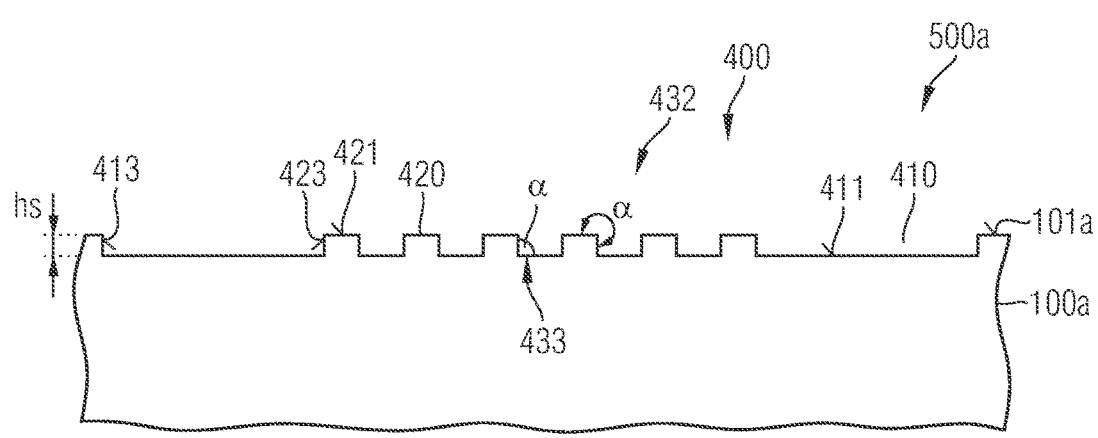
FIG. 3B is a schematic vertical cross-sectional view of the semiconductor substrate portion of FIG. 3A along line B-B.

FIGS. 3A and 3B illustrates an embodiment of an alignment structure 400 that may be formed in a region of the semiconductor substrate 500a, in which no semiconductor dies for semiconductor devices are formed, for example in a scribe line or wafer kerf separating neighboring regions for the formation of individual semiconductor dies. According to other embodiments, the alignment structure 400 may be formed in an inactive region of a semiconductor die.

The alignment structure 400 includes a recess 410 extending from the process surface 101a into the semiconductor layer 100a. The recess 410 may have a rectangular shape with four inside corners 431 and with a minimum width of at least 100 μm, e.g. at least 125 μm. According to other embodiments, the recess 410 may be a polygon with more than four inside corners 431. A bottom surface 411 of the recess 410 is parallel to the process surface 101a. The alignment structure 400 further includes one or more fins 420 protruding from a bottom surface 411 of the recess 410.

The fins 420 have a minimum distance d0 of at least 25 μm, e.g., at least 60 μm to a closest one of the inside corners 431 of the recess 410. According to an embodiment the minimum distance d0 is at least 100 μm, e.g., at least 125 μm.

A vertical extension (height) hs of the alignment structure 400 defined by the distance between the process surface 101a and the bottom surface 411 may be in a range from 100 nm to 500 nm, for example in a range from 150 nm to 400 nm. A height of the fins 420 is equal to a depth of the recess 410 and the vertical extension hs of the alignment structure 400.

Other alignment structures include a dense pattern of parallel trenches, wherein a distance between the trenches is in the range of the trench width. During epitaxy, the growth rate is higher in narrow corners, where an angle across the free space between intersecting surfaces is smaller than 180°, for example about 90°. Narrow corners are the corners between sidewalls of a vertical trench and a bottom surface of the trench as well as the inside corners between two intersecting vertical sidewalls of a vertical trench. During epitaxy, material predominantly deposits in the narrow corners.

Starting from narrow corners, material deposited during epitaxy chamfers to some degree the intersecting vertical sidewalls of trenches and distorts the shape of the original alignment structure. After epitaxy an alignment structure imaged into to surface of the epitaxial layer typically does not longer include sufficiently steep features, which typically provide high optical contrast.

Instead, the alignment structure 400 of FIGS. 3A to 3B includes one or more isolated fins 420 spaced in all horizontal directions from an inner sidewall 413 of the recess 410, wherein a minimum distance d0 between the outermost fins 420 and the inner corners 431 of the recess 410 is at least 25 μm, e.g., at least 60 μm, 100 μm or at least 125 μm. At least one of the distances d1 and d2 between the outermost fins 420 and orthogonal sidewalls 413 of the recess 410 may be less than or approximately 60 μm such that the recess 410 can be fitted into a scribe line and the other of the distances d1 and d2 is selected to fulfil the condition that d0 is equal to or greater than 25 μm, 60 μm, 100 μm or 125 μm. A minimum value for one of d1 and d2 is 25 μm.

A first lateral extension b1 of the recess 410 along a longitudinal axis of the fins 420 may be selected smaller than the width of typical scribe lines or kerfs, e.g., in a range from 60 μm to 100 μm. A second lateral extension b2 of the recess 410 orthogonal to the longitudinal axis of the fins 420 may be wider than typical scribe lines or kerfs, e.g., in a range from 120 μm to 400 μm.

The four outside corners 432 of each fin 420 in the horizontal cross-section are wide corners where an angle α across the free space between two intersecting fin sidewalls 423, 425 is greater than 180°, for example 270°. Even at high growth rates the epitaxial growth rate is significantly lower along the inner sidewalls and in the wide corners 432 than in the narrow inside corners 431 formed by intersecting sidewalls 413 of the recess 410. The epitaxy distorts the shape of the fin 420 to a lower degree than the shape of trenches with the same vertical extensions such that the fins 420 can be used as alignment structure even after an epitaxial process at high growth rate. At a distance d0 of the fins 420 to the closest inner corner 431 of more than 60 μm, even after growth of an epitaxial layer with a thickness of about 6 μm to 20 μm, the epitaxial growth in the inner inside corner 431 of the recess 410 has only low impact on position and horizontal cross-sectional shape of the imaged fins 420 provided that the vertical extension of the recess 410 is in range from 100 nm to 1 μm, for example in a range from 150 nm to 400 nm and further provided that a height hs of the fins 420 is equal to a depth of the recess.

If the recess 410 is too deep, i.e., the distance between the bottom surface 411 of the recess 410 and the process surface 101a is too large, the increased epitaxial growth rate on sidewalls of the groove 410 and the fins 420 may be too large such that the shape of the alignment structure 400 is distorted even at low total epitaxial growth. If the alignment structure 400 is too shallow, the recess 410 may be leveled even at comparatively low total epitaxial growth.

Sidewalls 423, 425 of the fins 420 in the alignment structure 400 may have a slope angle of 45 degree or less with respect to a normal onto the process surface 101a. According to an embodiment, the sidewalls 423, 425 of the fins 420 may be vertical with respect to the process surface 101a or may deviate from the vertical direction by not more than 1°. After formation of one or more epitaxial layer(s) on the process surface 101a, the slope angle of imaged alignment structures in the epitaxial layer(s) may be even larger than 45°, for example in a range of 45° to 85°.

The fins 420 may have a rectangular cross-sectional area in a horizontal plane parallel to the process surface 101a. A width w1 of the fins 420 may be in a range from 2 μm to 20 μm, e.g., about 10 μm. A length w2 of the fins 420 may be in a range from 5 μm to 70 μm, e.g., about 40 μm. A center-to-center distance d3 between neighboring fins 420 may be in a range from 15 µm to 40 µm, e.g., about 20 µm.

FIG. 4 shows alignment dependencies among first patterning processes I for forming a foundation that includes a super-junction structure and second patterning processes II for forming a super-junction device structure that may include transistor cells, wherein the super-junction structure may be formed at least partly in an epitaxial layer grown onto the foundation after formation of the super-junction structure.

In a base layer L0 a patterning process defines an initial alignment structure 900 and first implants 901 into a device area (see box Algn+Imp). Implant masks for second implants 905 are directly aligned to the initial alignment structure 900. An epitaxy process projects the initial alignment structure 900 into an imaged alignment structure 910 (see box i–Algn) in a first epitaxial layer L1. Third implants 915 are aligned directly to the imaged alignment structure 910. In a second epitaxial layer L2 a substitutional alignment structure 922 and fourth implants 923 are formed using position information about an imaged alignment structure 921 projected into the surface of the second epitaxial layer L2 (see box SAlgn+Imp). Fifth implants 925 are directly aligned to the substitutional alignment structure 922.

The pattern may be repeated several times, see for example imaged substitutional alignment structures 930, 941, 950 and substitutional alignment structure 942 as well as further implants 935, 943, 945, 955, wherein layer thickness and the number of layers between successively formed substitutional alignment structures may be constant or may alter.

Termination structures 980 as well as a super-junction device structure 990 that may include transistor cells are formed in lithography levels that may use a substitutional alignment structure or an image of a substitutional alignment structure for aligning further exposure masks to the foundation I, which includes a super-junction structure emerging from the implants 905, 915, . . . .

Figure 5C:
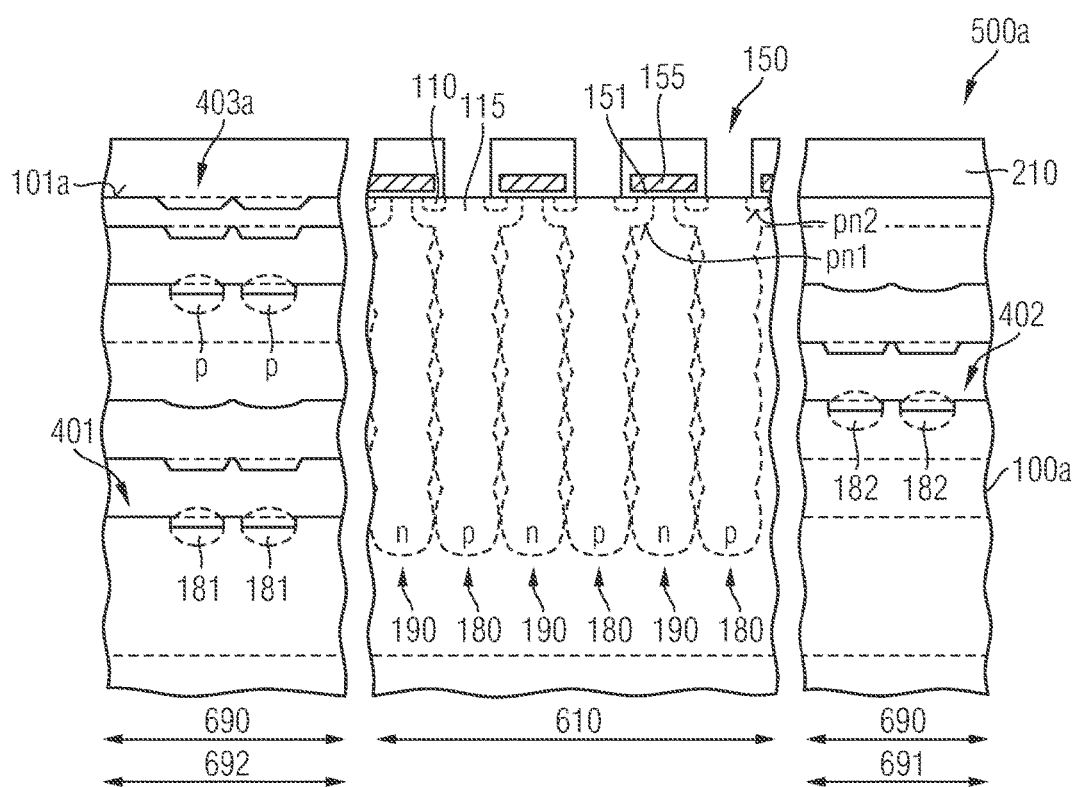
FIG. 5C is a schematic vertical cross-sectional view of portions of a semiconductor substrate according to an embodiment including a substitutional alignment structure imaged into a process surface of a semiconductor layer.

FIGS. 5A to 5C illustrate semiconductor substrates 500a for manufacturing of super-junction semiconductor devices, which may be or may include IGFETs (insulated gate field effect transistors), IGBTs (insulated gate bipolar transistors) or power semiconductor diodes. The semiconductor substrate 500a may be a semiconductor wafer at any processing stage after formation of an initial alignment structure 401 and after formation of portions of a super-junction structure 170 in a device area 610, wherein the initial alignment structure 401 may be formed in a first kerf portion 691 of a kerf area 690 that forms a grid enclosing single device areas 610. The initial alignment structure 401 may have structure and dimensions of the alignment structure 400 described with reference to FIGS. 3A and 3B, for example.

The semiconductor substrate 500a may consist of or may contain a semiconductor layer 100a of a semiconductor material such as crystalline silicon. The semiconductor substrate 500a may include further conductive, dielectric or semiconducting portions. For example, the semiconductor layer 100a may be an epitaxy base 105a formed on a base substrate 104. The base substrate 104 may be obtained from a semiconductor ingot and may be thinned or completely removed during processing. The epitaxy base 105a may be an n-doped epitaxial layer formed on the base substrate 104.

In the device area 610 the semiconductor layer 100a may include portions of a super-junction structure 170 with p-type columns 180 and n-type columns 190 alternating along at least one horizontal direction. For example, the p-type columns 180 and the n-type columns 190 may form parallel stripes extending into a horizontal direction perpendicular to the cross-sectional plane. In the vertical direction, each p-type column 180 may include sub portions which are connected to each other or which may be separated from each other.

FIG. 5A refers to a process stage, in which a first kerf portion 691 includes a substitutional alignment structure 402 comprising recesses 173 formed in the process surface 101a of the semiconductor layer 100a, wherein the semiconductor layer 100a includes at least two epitaxial layers 110a, 120a. The substitutional alignment structure 402 has the structure and dimensions of the alignment structure 400 of FIGS. 3A and 3B. In the device areas 610 p- and n-doped portions of the super-junction structure 170 are formed. The recesses 173 are also formed in the device regions at the process surface 101a in the vertical projection of the p-type implant regions 180.

In addition, the semiconductor layer 100a may include an imaged alignment structure 401b in a second kerf portion 692 of the kerf area 690. The imaged alignment structure 401b may include a number of shallow fins 420b with tilted sidewalls within an area defined by the horizontal dimensions of the substitutional alignment structure 402.

In FIG. 5B the semiconductor substrate 500a includes an imaged substitutional alignment structure 402a resulting from epitaxial growth on the substitutional alignment structure 402 of FIG. 5A. The imaged substitutional alignment structure 402a includes a shallow recess 410a and at least one shallow fin 420a extending from the shallow recess 410a and spaced from sidewalls of the shallow recess 410a in all horizontal directions. Sidewalls of the shallow fin 420a are tilted to the vertical direction by at least 15 degrees. The lateral center-to-center distance or pitch of the shallow fins 420a is in a range from 15 µm to 30 µm, for example in a range from 18 µm to 22 µm.

FIG. 5C illustrates the semiconductor substrate 500a at a process stage after formation of gate structures 150 in the device areas 610. The thermal budget applied during processing leads to a broadening of the p- and n-type implant regions by diffusion. In the device area 610, the p-type implant regions merge along the vertical direction resulting in the p-type or first columns 180, whereas the n-type implant regions merge along the vertical direction resulting in the n-type or second columns 190.

The gate structures 150 may be lateral gates formed outside of the semiconductor layer 100a along the process surface 101a as illustrated. According to another embodiment the gate structures 150 may be trench gates extending from the process surface 101a into the semiconductor layer 100a. The gate structures 150 may include a conductive gate electrode 155 which may include or consist of a heavily doped polycrystalline silicon layer or a metal-containing layer. The gate structures 150 further include a gate dielectric 151 separating the gate electrode 155 from the semiconductor layer 100a. The gate dielectric 151 may include or consist of a semiconductor oxide, for example thermally grown or deposited silicon oxide, silicon nitride, for example deposited or thermally grown silicon nitride, a semiconductor oxynitride, for example silicon oxynitride, or a combination thereof. An interlayer dielectric 210 may cover the gate electrodes 155.

Source zones 110 and body zones 115 for transistor cells may be formed in a topmost epitaxial layer 190a. In the kerf area 690, a substitutional alignment structure (not illustrated) and/or an imaged substitutional alignment structure 403a may be formed in a process surface 101a of the semiconductor layer 100a.

FIG. 6 shows a semiconductor device 500, which may be or may include an IGFET, an IGBT, or a power semiconductor diode. In an active region 614 of the semiconductor device 500 functional transistor cells TC or an anode zone of a power semiconductor diode are formed through which a load current directly flows in an on-state or forward mode of the semiconductor device 500. An inactive region 615 is devoid of functional transistor cells and devoid of an anode zone of a power semiconductor diode. In an on-state or forward mode no load current flows directly through the inactive region 615. The inactive region 615 may be a portion of the semiconductor device 500 in or beyond a termination area or below gate conductors, by way of example. According to an embodiment, the inactive region 615 may be a remnant of a kerf area. The inactive region 615 includes alignment structures as discussed above.

The semiconductor device 500 may include a semiconductor portion 100 of a semiconductor material such as crystalline silicon. The semiconductor portion 100 may include a drift structure 120 with a super-junction structure 170 including first and second columns 180, 190 of complementary conductivity types and may include further conductive, dielectric or semiconducting portions.

Transistor cells TC may be formed in the semiconductor portion 100 along a first surface 101. The transistor cells TC may be based on trench gates or planar gates with gate structures 150 as described with reference to FIG. 5C.

The transistor cells TC include body zones 115 that form first pn junctions pn1 with the second columns 190 of the super-junction structure 170 and second pn junctions pn2 with source zones 110. The body zones 115 may be wells extending from the first surface 101 into the semiconductor portion 100. The source zones 110 may be wells extending from the first surface 101 into the body zones 115. The source zones 110 and the body zones 115 may be electrically connected to a first load electrode 310. The gate dielectric 151 capacitively couples the gate electrode 155 to channel portions of the body zones 115.

Along a second surface 102 opposite to the first surface 101 the semiconductor portion 100 may include a heavily doped contact layer 129 electrically connected to a second load electrode 320, which may form or which may be directly connected to a drain terminal in case the semiconductor device 500 is an IGFET. A field stop layer 128 with a lower dopant concentration as the contact layer 129 may be sandwiched between the contact layer 129 and a low doped drift zone 121.

The inactive region 615 includes an alignment structure 400, which may be a substitutional alignment structure or an imaged substitutional alignment structure. An interlayer dielectric 210 may cover the alignment structure 400 and the gate structures 150. The alignment structure 400 may be or may be based on the structure and dimensions of the alignment structure 400 of FIGS. 3A and 3B.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device in a semiconductor body, the method comprising:
   (a) forming an initial mask on a process surface of a semiconductor layer, the initial mask comprising openings exposing a part of the semiconductor layer in an alignment structure area and in a super-junction structure area;
   (b) forming a recess structure in the semiconductor layer at portions of the process surface that are exposed by the openings of the initial mask, wherein the recess structure in the alignment structure area constitutes an initial alignment structure comprising a recess with a minimum width of at least 100 μm and a vertical extension in a range from 100 nm to 1 μm, and at least one fin formed within a groove at a distance of at least 60 μm to a closest inside corner of the groove;
   (c) introducing dopants into the semiconductor layer through portions of the process surface that are exposed by the openings of the initial mask, wherein the dopants introduced in the super-junction area constitute part of a super-junction structure;
   (d) increasing a thickness of the semiconductor layer by growing an epitaxial layer, wherein the initial alignment structure is imaged into the process surface;
   (e) introducing dopants into the semiconductor layer by using a mask aligned to the initial alignment structure; and
   (f) repeating (d).

2. The method of claim 1, further comprising repeating (e) and (f) at least once, wherein the respective mask is aligned to the initial alignment structure.

3. The method of claim 2, further comprising:
   (g) forming a substitutional mask aligned to the initial alignment structure; and
   (h) repeating (b) to (f) based on a substitutional alignment structure instead of the initial alignment structure.

4. The method of claim 3, wherein the substitutional alignment structure comprises a recess with a minimum width of at least 100 μm and a vertical extension in a range from 100 nm to 1 μm, and at least one fin formed within a groove at a distance of at least 60 μm to a closest inside corner of the groove.

5. The method of claim 3, further comprising repeating (g) and (h) at least once, wherein the respective mask is aligned to the substitutional alignment structure.

6. The method of claim 5, further comprising:
   forming transistor cells in the semiconductor layer, wherein implant and etch masks for forming the transistor cells are aligned to the substitutional or to the further substitutional alignment structure imaged into the process surface.

7. The method of claim 1, wherein the process surface is a {001} crystal plane and sidewalls of the at least one fin are {110} crystal planes.

8. The method of claim 1, wherein sidewalls of the at least one fin extend along <110> crystal directions.

9. The method of claim 1, wherein:
   a length of the at least one fin is in a range from 5 μm to 70 μm; and a width of the at least one fin is in a range from 2 μm to 20 μm.

10. The method of claim 1, wherein each epitaxial layer has a thickness in a range from 3 μm to 7 μm.

11. The method of claim 1, wherein the semiconductor body is a semiconductor wafer and the alignment structure area is part of a dicing pattern area of the semiconductor wafer, and wherein the method further comprises dividing the semiconductor wafer into a plurality of semiconductor dies by a dicing process.

12. The method of claim 1, wherein, with respect to the super-junction area, a pattern of the dopants introduced through the openings of the initial mask into the super-junction structure area of the semiconductor layer is congruent with a pattern of the dopants introduced into the super-junction structure area through the openings of the mask aligned to the initial alignment structure.

13. The method of claim 1, wherein, with respect to the super-junction area, a pattern of the dopants introduced through the openings of the initial mask into the super-junction structure area of the semiconductor layer differs from a pattern of the dopants introduced through the openings of the mask aligned to the initial alignment structure.

14. The method of claim 1, further comprising in-situ doping of the semiconductor layer, wherein a conductivity type of the in-situ doped semiconductor layer differs from the conductivity type of the dopants introduced through the openings of the initial mask.

15. The method of claim 1, further comprising introducing dopants into the semiconductor layer in the super-junction area by an ion implantation process that is unmasked in the super-junction area.

16. The method of claim 1, wherein the dopants are p-type dopants and the semiconductor layer is n-doped.

17. The method of claim 1, further comprising thermal processing configured to intermix some of the dopants introduced at different depths of the semiconductor layer by a vertical diffusion process.

18. A method of manufacturing a semiconductor device in a semiconductor body, the method comprising:
(a) forming an initial mask on a process surface of a semiconductor layer, the initial mask comprising openings exposing a part of the semiconductor layer in an alignment structure area and in a super-junction structure area;
(b) forming a recess structure in the semiconductor layer at portions of the process surface that are exposed by the openings of the initial mask, wherein the recess structure in the alignment structure area constitutes an initial alignment structure;
(c) introducing dopants into the semiconductor layer through portions of the process surface that are exposed by the openings of the initial mask, wherein the dopants introduced in the super-junction area constitute part of a super-junction structure;
(d) increasing a thickness of the semiconductor layer by growing an epitaxial layer, wherein the initial alignment structure is imaged into the process surface;
(e) introducing dopants into the semiconductor layer by using a mask aligned to the initial alignment structure;
(f) repeating (d); and further comprising
repeating (e) and (f) at least once, wherein the respective mask is aligned to the initial alignment structure; and further comprising
(g) forming a substitutional mask aligned to the initial alignment structure; and
(h) repeating (b) to (f) based on a substitutional alignment structure instead of the initial alignment structure.

19. A method of manufacturing a semiconductor device in a semiconductor body, the method comprising:
(a) forming an initial mask on a process surface of a semiconductor layer, the initial mask comprising openings exposing a part of the semiconductor layer in an alignment structure area and in a super-junction structure area;
(b) forming a recess structure in the semiconductor layer at portions of the process surface that are exposed by the openings of the initial mask, wherein the recess structure in the alignment structure area constitutes an initial alignment structure;
(c) introducing dopants into the semiconductor layer through portions of the process surface that are exposed by the openings of the initial mask, wherein the dopants introduced in the super-junction area constitute part of a super-junction structure;
(d) increasing a thickness of the semiconductor layer by growing an epitaxial layer, wherein the initial alignment structure is imaged into the process surface;
(e) introducing dopants into the semiconductor layer by using a mask aligned to the initial alignment structure; and
(f) repeating (d); and further comprising
introducing dopants into the semiconductor layer in the super-junction area by an ion implantation process that is unmasked in the super-junction area.

* * * * *